US010158155B2

(12) United States Patent
Muterspaugh

(10) Patent No.: US 10,158,155 B2
(45) Date of Patent: Dec. 18, 2018

(54) FILTER-TERMINATION COMBINATION FOR MULTI-BAND RECEIVER

(71) Applicant: THOMSON LICENSING, Issy les Moulineaux (FR)

(72) Inventor: Max W. Muterspaugh, Westfield, IN (US)

(73) Assignee: InterDigital CE Patent Holdings, Paris (FR)

( * ) Notice: Subject to any disclaimer, the term of this patent is extended or adjusted under 35 U.S.C. 154(b) by 0 days.

(21) Appl. No.: 15/501,828

(22) PCT Filed: Jun. 24, 2015

(86) PCT No.: PCT/US2015/037365
§ 371 (c)(1),
(2) Date: Feb. 4, 2017

(87) PCT Pub. No.: WO2016/022222
PCT Pub. Date: Feb. 11, 2016

(65) Prior Publication Data
US 2017/0244144 A1    Aug. 24, 2017

Related U.S. Application Data

(60) Provisional application No. 62/033,033, filed on Aug. 4, 2014.

(51) Int. Cl.
*H01P 1/26* (2006.01)
*H03H 7/07* (2006.01)
(Continued)

(52) U.S. Cl.
CPC ............... *H01P 1/26* (2013.01); *H03H 7/06* (2013.01); *H03H 7/07* (2013.01); *H03H 7/1708* (2013.01);
(Continued)

(58) Field of Classification Search
CPC ... H01P 1/26; H03H 7/07; H03H 7/06; H03H 7/01; H03H 7/1741; H03H 7/175;
(Continued)

(56) References Cited

U.S. PATENT DOCUMENTS 5,130,677 A * 7/1992 Takai ................. H03H 7/38
                                                 333/22 R
7,808,340 B2 * 10/2010 Colussi ................. H04B 3/14
                                                 333/28 R
(Continued)

FOREIGN PATENT DOCUMENTS

WO    WO2013192133    12/2013

OTHER PUBLICATIONS

Kang et al., "Color decomposition method for multi-primary display using 3D-LUT in linearized LAB space", Proceedings of the SPIE, Color Imaging X, vol. 5667, 2005, pp. 354-363.
(Continued)

*Primary Examiner* — Stephen E. Jones
(74) *Attorney, Agent, or Firm* — Jeffrey M. Navon

(57) ABSTRACT

A termination/attenuation network applies to an input of a set-top box a MOCA channel signal having a narrow band of frequencies and included in RF signals having a wide band of frequencies received via a cable from a satellite antenna. The network includes a pair of series resistors and a parallel resistor coupled to a junction terminal between the pair of series resistors in a T-shaped configuration. A series-pass band-pass filter (L1, C2) bypasses the pair of series resistors and a parallel band stop filter (L2, C1) decouples the parallel resistor at the frequency band of the MOCA channel signal for selectively reducing attenuation at the frequency band of the MOCA channel signal.

19 Claims, 8 Drawing Sheets

(51) Int. Cl.
  *H03H 7/06* (2006.01)
  *H03H 7/38* (2006.01)
  *H03H 7/01* (2006.01)
(52) U.S. Cl.
  CPC ........ *H03H 7/1775* (2013.01); *H03H 7/1791* (2013.01); *H03H 7/38* (2013.01)
(58) Field of Classification Search
  CPC .. H03H 7/1758; H03H 7/1766; H03H 7/1775; H03H 7/1783; H03H 7/1791
  USPC .................................. 333/22 R, 28 R, 81 R
  See application file for complete search history.

(56) References Cited

U.S. PATENT DOCUMENTS

| | | | |
|---|---|---|---|
| 8,695,055 | B2 | 4/2014 | Labro |
| 8,752,114 | B1 | 6/2014 | Shapson et al. |
| 2002/0190811 | A1* | 12/2002 | Sperber .................. H04B 3/143 333/28 R |
| 2005/0062554 | A1* | 3/2005 | Cogdill ................... H03H 7/38 333/22 R |
| 2008/0225902 | A1 | 9/2008 | Chung et al. |
| 2011/0187481 | A1 | 8/2011 | Alkan et al. |
| 2012/0025929 | A1 | 2/2012 | Muterspaugh et al. |
| 2013/0181789 | A1 | 7/2013 | Rijssemus |
| 2016/0380607 | A1* | 12/2016 | Liu ........................ H03H 7/004 333/172 |

OTHER PUBLICATIONS

Anonymous, "Digital Video Broadcasting (DVB); Framing structure, channel coding and modulation for 11/12 GHz satellite services", ETSI Standard EN 300 421 V1.1.2, Aug. 1997, pp. 1-24.
Anonymous, "Digital Video Broadcasting (DVB); Framing structure, channel coding and modulation for digital terrestrial television", ETSI EN 300 744 V1.6.1 Jan. 2009, pp. 1-66.
Anonymous, "MoCA Band Pass Filter", Murata Manufacturing Co. Ltd., Jun. 2014, pp. 1-3.
Anonymous, "A/53: ATSC Digital Television Standard, Parts 1-6", Advanced Television Systems Committee, Inc., Washington, D.C., USA, Jan. 3, 2007, pp. 1-136.
Anonymous, "Digital Video Broadcasting (DVB);Framing structure, channel coding and modulation for cable systems", ETSI Standard EN 300 429 V1.2.1, Apr. 1998, pp. 1-20.

* cited by examiner

FILTER-TERMINATION COMBINATION FOR MULTI-BAND RECEIVER

This application claims the benefit, under 35 U.S.C. § 365 of International Application PCT/US2015/037365, filed Jun. 24, 2015, which was published in accordance with PCT Article 21(2) on Feb. 11, 2016, in English, and which claims the benefit of U.S. Provisional Patent Application No. 62/033,033 filed Aug. 4, 2014. The U.S. Provisional and PCT Applications are expressly incorporated by reference herein in their entirety for all purposes.

FIELD OF THE INVENTION

The invention relates to a radio frequency (RF) filter forming a termination.

BACKGROUND OF THE INVENTION

Many home entertainment devices not only include the capability to communicate with other devices in a home network but also include the ability to receive and/or process available media content from a plurality of sources, including a plurality of providers. The sources and providers may include, but are not limited to, satellite service, cable service, and free to home over the air terrestrial service. The services may operate in the same or different radio frequency (RF) ranges and may use the same or different transmission formats or protocols. The devices for receiving the services often include, but are not limited to, set-top boxes, gateways, televisions, home computers, and the like.

The operation of home entertainment devices is further complicated by the inclusion of home networking functions in the devices. Many of these devices use a home networking that shares the transmission medium such as cable with the incoming transmission system from the service providers. One such example is a multimedia over cable alliance (MOCA) home network system that operates from an RF signal provided by a cable in a frequency spectrum of 950 MHz-1050 MHz. The frequency spectrum, 950 MHz-1050 MHz, is unused by the other signal transmission systems. Examples of other signal transmission systems would be satellite down link frequencies from 1250 to 2150 MHz, broadcast television from 174 to 805 MHz and certain control frequencies from 2.3 to 2.4 MHz that are all contained in the same cable together with the MOCA RF signal.

Return loss is a measurement of how well the impedance of a load, including, for example, a filter that is driven from the signal contained in the cable, is matched to the characteristic impedance of the cable. The return loss is a number associated with a corresponding interface that is calculated from the reflection caused at the corresponding interface as a result of an impedance mismatch. The return loss is usually expressed as a ratio in decibels (dB).

The above mentioned filter may be a band-pass filter that passes the MOCA band signals and blocks the passage of signals at frequencies outside the MOCA band contained in the same cable along with the MOCA band signals. It may be desirable to avoid significant input return loss with respect to each signal that is contained in the same cable containing the MOCA band signals. Ideally, it may be desirable to provide a termination to the cable, for example, 75 ohms that matches the characteristic impedance of the cable for each signal within the frequency spectrum that is contained in the same cable including the MOCA band signals.

Typical practice is to design diplex, triplex or higher order L-C filters to divide the frequency bands. A corresponding termination such as a 75 ohm resistor would be coupled to an output of each of the filters. However, these filters are complex having a relatively large number of parts and require a corresponding filter for each of the frequency bands of the corresponding RF signals, not just for the RF signal at the band such as MOCA.

It is also well known to utilize a resistive network commonly referred to as "pad" for providing a terminating resistance over a wide frequency band. For example, a 6 dB pad will provide a −12 dB or better return loss S11 even in the extreme case in which an output terminal of the pad is either an open or short circuit. However, utilizing such a resistive pad downstream the input of a receiver would, undesirably, degrade the noise figure by 6 dB.

In carrying out an advantageous feature, the 6 dB pad is supplemented with relatively simple band-pass filter such that the desired frequency band, for example, of the MOCA home network system can be subjected, advantageously, to lower attenuation while RF signals at the range of frequencies that excludes the MOCA band are attenuated more and terminated with the resistive pad that provides improved impedance matching.

SUMMARY

An advantageous termination network coupled in operation to an input of a band-pass filter includes a first resistor coupled to a second resistor to form a voltage divider for voltage dividing a first radio frequency (RF) input signal that is applied to the filter input. It also includes a first resonant circuit responsive to the first RF input signal for controlling a magnitude of a second RF input signal developed at the filter input. The magnitude of the second RF input signal is controlled in a manner to increase the second RF input signal, when the first RF input signal is at a resonant frequency of the first resonant circuit, relative to when the first RF input signal is outside a range of frequencies that includes the resonant frequency.

DETAILED DESCRIPTION

Figure 1:
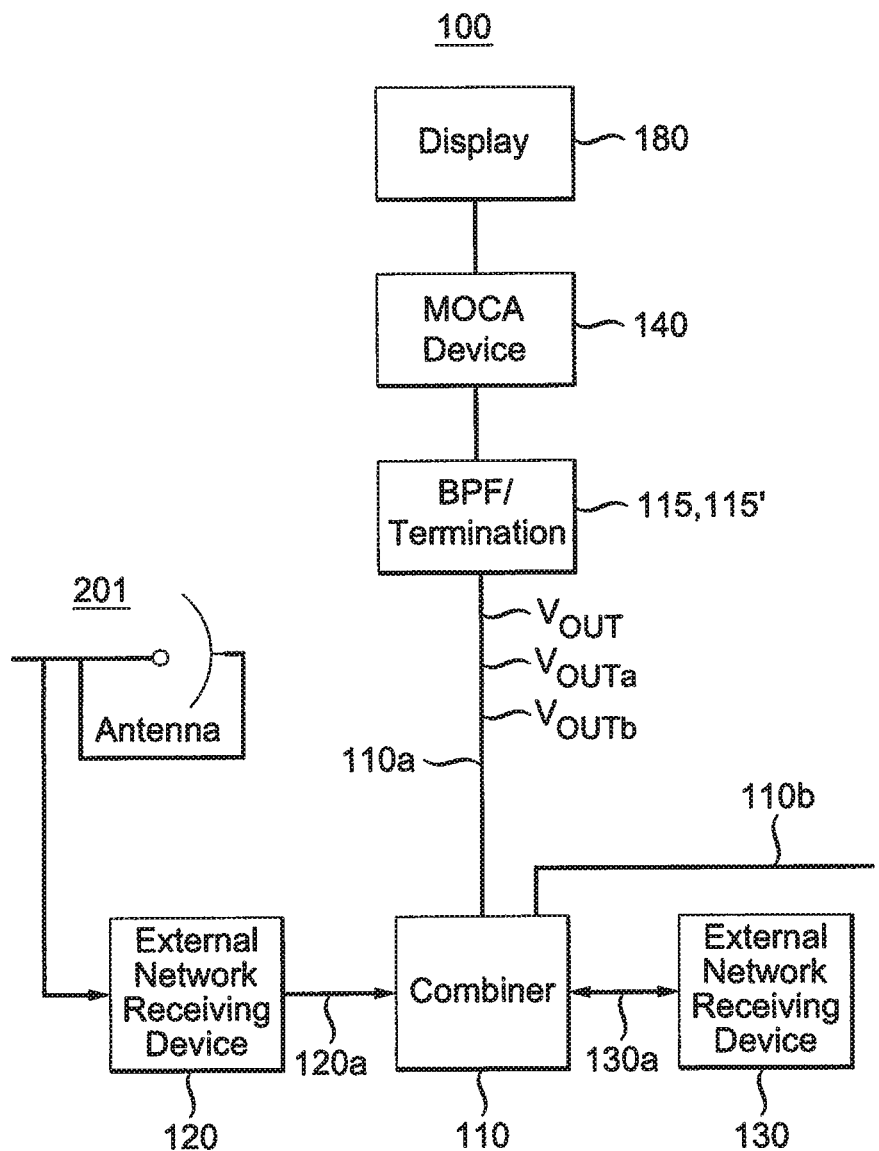
FIG. 1 illustrates a home network that includes a band-pass filter/termination, embodying advantageous aspects.

FIG. 1 illustrates a block diagram of an embodiment of a system 100 for providing home entertainment media content in a home, or end user, network. The media content, originating from a content provider, is provided through an external network receiving device 130 and also through an external network receiving device 120 to a hybrid coupler or combiner 110. The media content may be provided using any one of the standard transmission protocols and standards for content delivery (e.g., Advanced Television Systems Committee (ATSC) A/53, digital video broadcast (DVB)-Cable (DVB-C), DVB-Satellite (DVB-S), or DVB-Terrestrial (DVB-T)). For example, external network receiving device 120 receives the media content via a satellite antenna dish 201. Combiner 110 is also connected to a Multimedia over Cable Alliance (MOCA) network device 140 via a radio frequency (RF) transmission line 110a having a characteristic impedance of, for example, 75 OHM and via a combination of a band-pass filter and a termination network referred to herein as a band-pass filter/termination 115, embodying an advantageous feature. Combiner 110 may be connected to other devices, not shown, via, for example, an RF transmission line 110b.

In particular, combiner 110 provides a routing arrangement for an output signal 120a of external network receiving device 120 that is applied to devices in the home or user network such as MOCA device 140 in conjunction with signals that operate in the MOCA network. Combiner 110 is conventional and may include active or passive circuit elements to combine the input signals from the various sources into a corresponding combined output signal in each of transmission lines 110a and 110b, for example, into a combined output signal Vout in transmission line 110a. MOCA device 140 may be controlled by the user to convert one or more of the program content from device 130 or 120 into a MOCA output at the MOCA frequency spectrum of 950 MHz-1050 MHz, in a manner not shown in details, for use with other MOCA devices on the network. The converted MOCA signal, not shown, is applied back to combiner 110 to form an RF signal Vouta at the MOCA frequency spectrum of 950 MHz-1050 MHz. Consequently, combined output signal Vout in transmission line 110a also contains RF signal Vouta at the MOCA frequency spectrum of 950 MHz-1050 MHz. As a result, RF signal Vout, as well as other outputs of combiner 110, such as, for example, those signals, not shown, that are developed on line 110b, will also contain all original signals, for example, satellite down link frequencies from 1250 to 2150 MHz, broadcast television frequencies from 174 to 805 MHz and certain control frequencies from 2.3 to 2.4 MHz referred to collectively as a signal Voutb. In addition, signal Vout also contains internally generated MOCA RF signal Vouta. For combiner 110 to function properly, it may be desirable to provide terminating impedance with a value close to the characteristic impedance of the combiner and of the coaxial cables, for example, 75 ohms as mentioned before.

Figure 2:
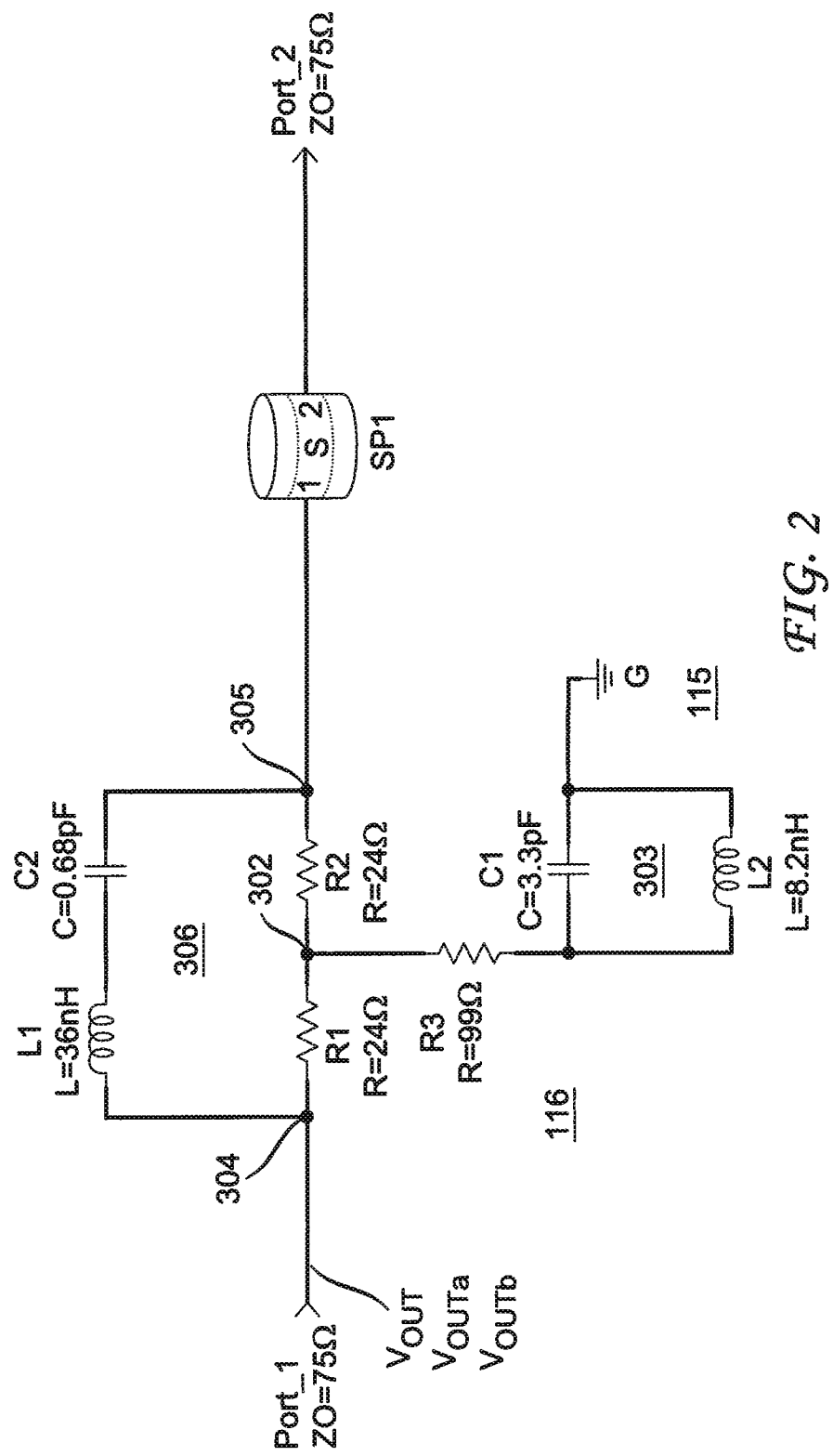
FIG. 2 illustrates a detailed schematics of a first embodiment of the band-pass filter/termination of FIG. 1.

FIG. 2 illustrates a more detailed circuit diagram of band-pass filter/termination 115 of FIG. 1, embodying advantageous features. Similar symbols and numerals in FIGS. 1 and 2 indicate similar items or functions. In FIG. 2, an advantageous termination portion 116 included in band-pass filter/termination 115 includes a first end terminal 304 of a resistor R1, referred to herein as an input port 1 of band-pass filter/termination 115, that is coupled to a signal carrying conductor, not shown, of transmission line 110a of FIG. 1. In transmission line 110a signal Vout that includes signals Vouta and Voutb is developed. Resistor R1 of FIG. 2 has a second end terminal forming a junction terminal 302 with a resistor R3. A second end terminal of resistor R3 is coupled in series with a parallel resonant circuit 303 having a second terminal that is coupled to a common conductor G of transmission line 110a of FIG. 1. Parallel resonant circuit 303 includes an inductor L2 coupled in parallel with a capacitor C1. Thus, resistor R3 and parallel resonant circuit 303 is tuned to resonate at a frequency, for example, 1000 MHz that is within the MOCA band of frequencies, 950 MHz-1050 MHz, of signal Vouta. Consequently, parallel resonant circuit 303 forms high impedance or a band-stop filter at the frequencies within the MOCA band of frequencies of signal Vouta. As a result, resistor R3 has only a minimal effect on attenuation of termination band-pass filter/termination 115 at the frequencies within the MOCA band of frequencies of signal Vouta. A resistor R2 has a first end terminal in common with junction terminal 302.

A series resonant circuit 306 includes an inductor L1 coupled in series with a capacitor C2. Series resonant circuit 306 is coupled between a second terminal 305 of resistor R2 and terminals 304 and in parallel with series coupled resistors R1 and R2. Series resonant circuit 306 is also tuned to resonate at a frequency, for example, 1000 MHz that is within the MOCA band of frequencies, 950 MHz-1050 MHz, of signal Vouta. Consequently, series resonant circuit 306 forms a low impedance or a band-pass filter at the frequencies within MOCA band of frequencies, 950 MHz-1050 MHz, of signal Vouta in a manner to bypass the signal path formed by series coupled resistors R1 and R2. The result is that resistors R1 and R2 have only a minimal attenuation effect at the frequencies within the MOCA band of frequencies, 950 MHz-1050 MHz, of signal Vouta.

Advantageously, series resonant circuit 306 forms high impedance at the frequencies within the frequency spectrum of signal Voutb that excludes MOCA signal Vouta. Thus, with respect to signal Voutb at the frequencies within the frequency spectrum that is non-overlapping with the MOCA band of frequencies, 950 MHz-1050 MHz, of signal Vouta, resistors R1 and R2 dominate the impedance formed between terminals 304 and 305 for attenuating signal Voutb. Advantageously, the bypassing effect of series resonant circuit 306 does not significantly diminish the desirable attenuation of signal Voutb.

On the other hand, parallel resonant circuit 303 forms low impedance at the frequencies within the frequency spectrum of signal Voutb. Thus, with respect to the frequencies within the frequency spectrum of signal Voutb that are non-overlapping with or excluding the MOCA band of frequencies, 950 MHz-1050 MHz, of signal Vouta, resistors R1 and R3 form a substantially resistive attenuating voltage divider. The result is that, with respect to signal Voutb, the combination of resistors R1, R2 and R3 that are coupled in a T-shaped configuration, advantageously, effectively forms a so-called Tee attenuator. Thus, advantageously, signal Vouta is coupled to terminal 305 of FIG. 2 without being significantly attenuated; whereas, advantageously, non-MOCA signal Voutb that needs to be suppressed at terminal 305 is attenuated by the combination of resistors R1, R2 and R3. The inclusion of resonant circuits 306 and 303, advantageously, negates the attenuation of the resistive pad formed by the combination of resistors R1, R2 and R3 in the desired MOCA band of 950 to 1050 MHz. Adjusting the ratio of the inductance to capacitance, L/C ratio, in each of resonant circuits 306 and 303 can produce a desired pass band characteristic from 950 to 1050 MHz.

The values of the following components of termination portion 116 of band-pass filter/termination 115 of FIG. 2 are, as follows:

R1=24 Ohm
R2=24 Ohm
R3=99 Ohm
L1=36 nH
L2=8.2 nH
C1=3.3 pF
C2=0.68 pF

Terminal 305 of resistor R2, forming an output terminal of termination portion 116 also forms, in common, an input terminal, referred to as port 1-SP1 of a band-pass filter SP1. Band-pass filter SP1 has an output referred to herein as a port 2-SP1 of band-pass filter SP1. Port 2 of band-pass filter SP1 forms, in common, an output port of band-pass filter/termination 115.

Band-pass filter SP1 passes with low attenuation the signal at the frequencies spectrum of the MOCA band of frequencies, 950 MHz-1050 MHz, of signal Vouta. On the other hand, band-pass filter SP1 blocks or attenuates signals at frequencies within the frequency spectrum of signal Voutb that are non-overlapping with the MOCA band of frequencies, 950 MHz-1050 MHz, of signal Vouta. An example of such filter may be an LTCC device such as a prior art filter made by MURATA, LFB321CG00M8D792. LTCC is an abbreviation of Low Temperature Co-fired Ceramics. High purity ceramics used in the industrial world are also called "fine ceramics." Among fine ceramics, LTCC is classified as electronic ceramics which are used as electronic materials. Such filter provides low attenuation and good impedance match with respect to the MOCA 950 to 1050 MHz band of signal Vouta. However, input port 1-SP1 of band-pass filter SP1 generally forms input impedance that, disadvantageously, is significantly different at different frequencies over the frequency spectrum of signal Voutb. Other filter types may, instead, be employed such as conventional L-C types or SAW devices.

Figure 3:
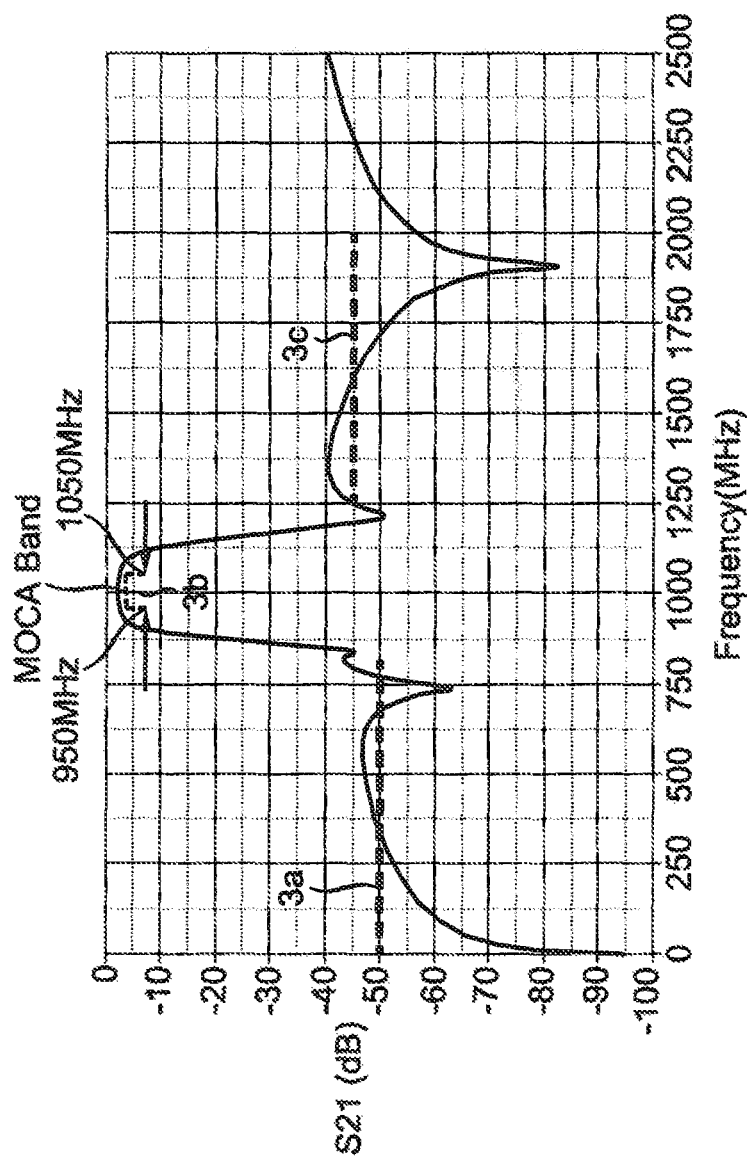
FIG. 3 illustrates a graph showing the selectivity or S-parameter S21 of a stand-alone band-pass filter that is included in the band-pass filter/termination of FIG. 2.

FIG. 3 illustrates a graph showing a selectivity or S-parameter S21 of stand-alone band-pass filter SP1 of FIG. 2. S-parameter S21 of FIG. 3 represents a ratio of the power received at port 2-SP1 of band-pass filter SP1 of FIG. 2 relative to the power input at port 1-SP1 of band-pass filter SP1. A broken line 3a of FIG. 3 represents a specification limit requirement for S-parameter S21 of band-pass filter/termination 115 of FIG. 2 that is better than minus 50 decibel (db) at frequencies below 800 MHz. By way of an example, S-parameter S21 of −55 db is better than S-parameter S21 of −50 db. A broken line 3b of FIG. 3 represents a specification limit requirement for S-parameter S21 of band-pass filter/termination 115 of FIG. 2 that is better than minus 5 db at the MOCA frequency band. By way of an example, S-parameter S21 of −3 db is better than S-parameter S21 of −5 db. A broken line 3c of FIG. 3 represents a specification limit requirement for S-parameter S21 of band-pass filter/termination 115 of FIG. 2 that is better than minus 55 db at frequencies between 1250 MHz and 2150 MHz.

Figure 4:
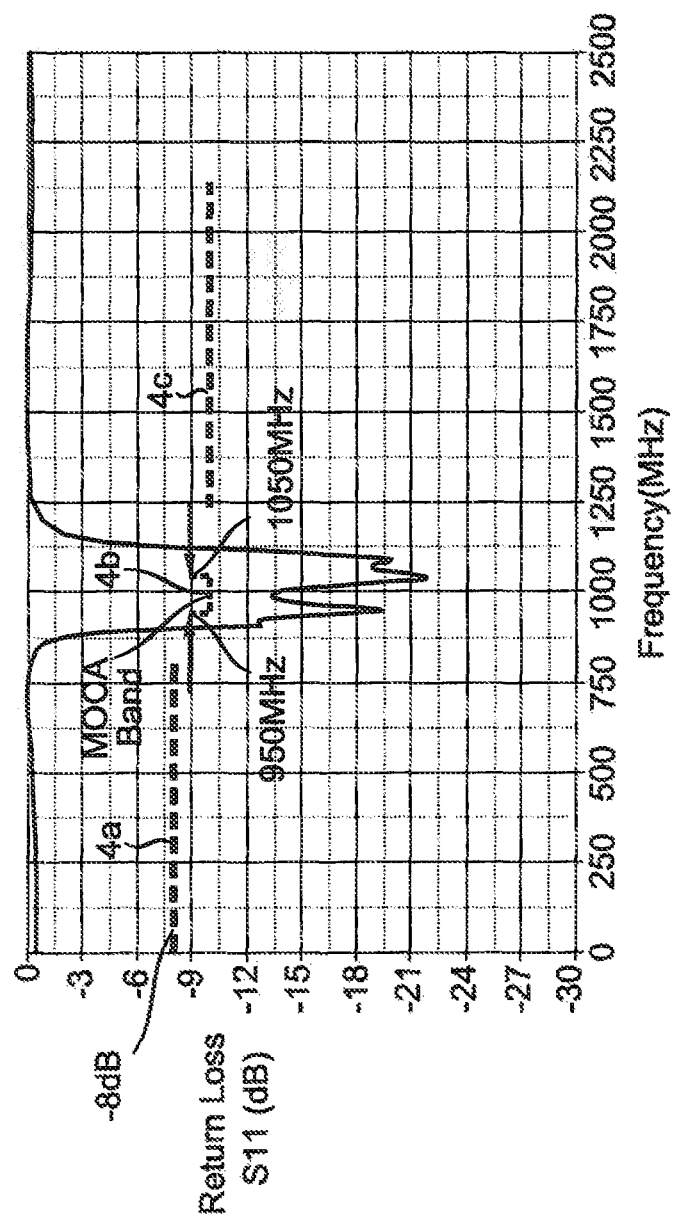
FIG. 4 illustrates a graph showing the return loss or S-parameter S11 of a stand-alone band-pass filter that is included in the band-pass filter/termination of FIG. 2.

FIG. 4 illustrates a graph showing the return loss or S-parameter S11 of stand-alone band-pass filter SP1 of FIG. 2. S-parameter S11 of FIG. 4 represents a ratio of the power reflected from port 1-SP1 of band-pass filter SP1 of FIG. 2 relative to the power input at port 1-SP1. A broken line 4a of FIG. 4 represents a specification limit requirement for S-parameter S11 of band-pass filter/termination 115 of FIG. 2 that is better than minus 8 db at frequencies below 800 MHz. A broken line 4b of FIG. 4 represents a specification limit requirement for S-parameter S11 of band-pass filter/termination 115 of FIG. 2 that is better than minus 10 db at the MOCA frequency band. A broken line 4c of FIG. 4 represents a specification limit requirement for S-parameter S11 of band-pass filter/termination 115 of FIG. 2 that is better than minus 10 db at frequencies between 1250 MHz and 2150 MHz. By way of an example, S-parameter S11 of −12 db is better than S-parameter S11 of −10 db.

Assume, hypothetically, that stand-alone band-pass filter SP1 of FIG. 2 is coupled to transmission line 110a of FIG. 1 without interposing termination portion 116 between transmission line 110a and stand-alone band-pass filter SP1. In this case, as demonstrated in the graph of FIG. 4, the specification limits of lines 4a and 4c would, disadvantageously, not be met.

Figure 5:
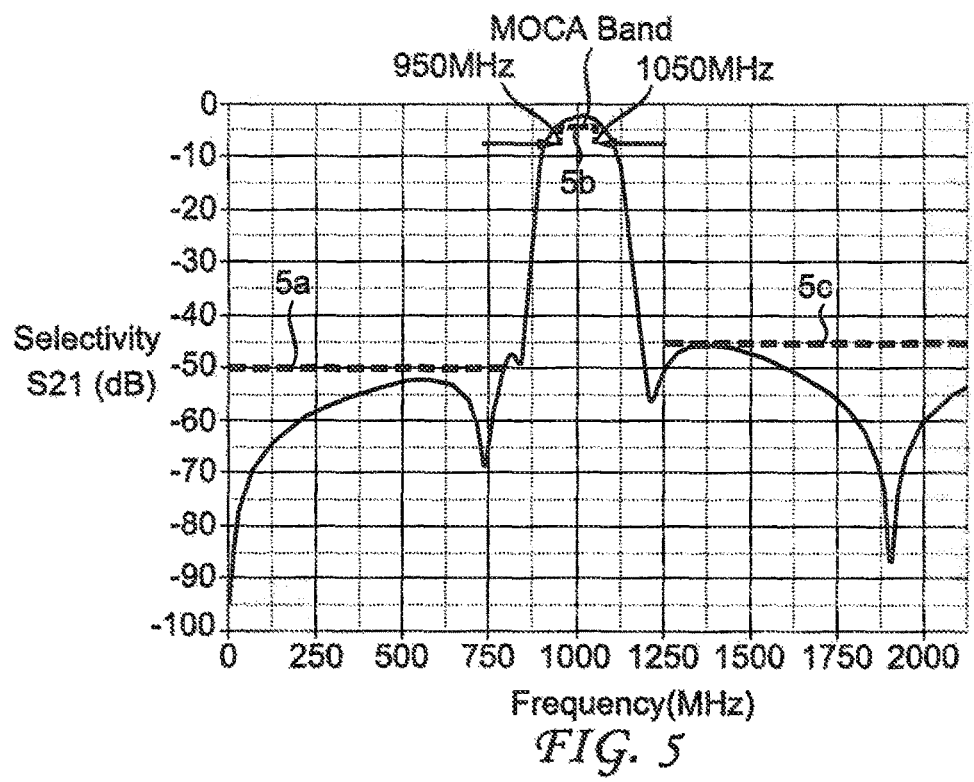
FIG. 5 illustrates a graph showing the selectivity or S-parameter S21 of the band-pass filter/termination of FIG. 2.

FIG. 5 illustrates a graph showing the selectivity or S-parameter S21 of band-pass filter/termination 115 of FIG. 2 that includes both termination portion 116 and band-pass filter SP1. S-parameter S21 of FIG. 5 represents the power received at port 2 of band-pass filter/termination 115 of FIG. 2 relative to the power input at port 1 that is at terminal 304 of band-pass filter/termination 115 of FIG. 2. A broken line 5a of FIG. 5, a broken line 5b and a broken line 5c represent the same specification limit requirements of broken lines 3a, 3b and 3c, respectively, of FIG. 3. As shown in FIG. 5, S-parameter S21 of band-pass filter/termination 115 of FIG. 2 meets the specification limit requirements, advantageously, even better than in FIG. 3.

Figure 6:
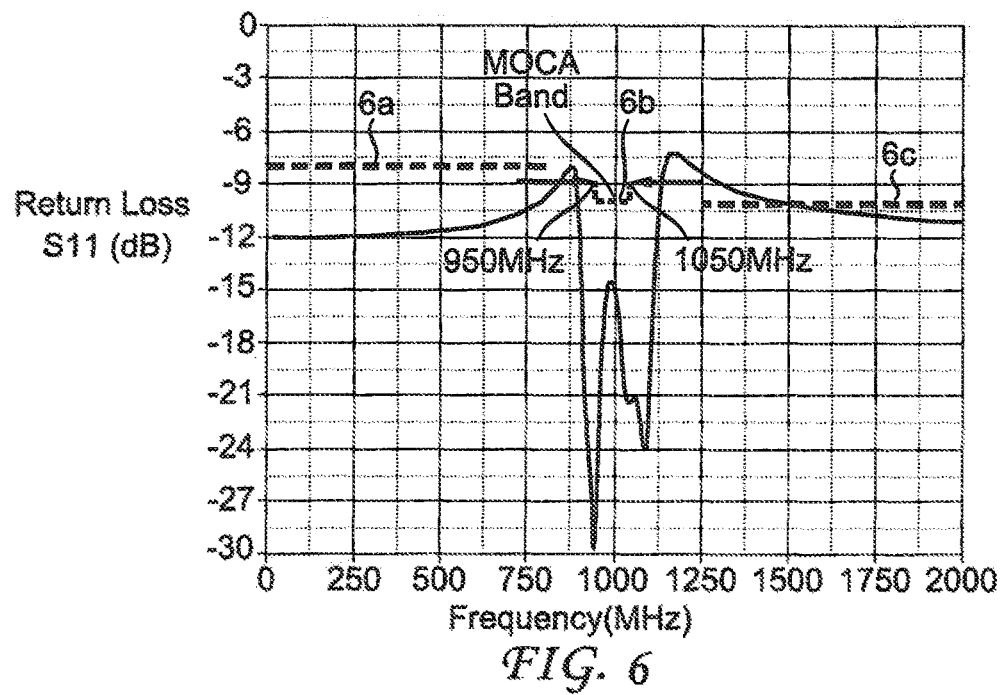
FIG. 6 illustrates a graph showing the return loss or S-parameter S11 of the band-pass filter/termination of FIG. 2.

FIG. 6 illustrates a graph showing the return loss or S-parameter S11 of band-pass filter/termination 115 of FIG. 2 that includes both termination portion 116 and band-pass filter SP1. S-parameter S11 of FIG. 6 represents the power reflected from port 1 of band-pass filter/termination 115 of FIG. 2 relative to the power input at port 1 of band-pass filter/termination 115. A broken line 6a of FIG. 6, a broken line 6b and a broken line 6c represent the same specification limit requirements of broken lines 4a, 4b and 4c, respectively, of FIG. 4. As shown in FIG. 6, S-parameter S11 of band-pass filter/termination 115 of FIG. 2 meets the specification limit requirements, advantageously, better than in FIG. 4. As shown in FIG. 6, band-pass filter/termination 115 of FIG. 2 fully meets the required impedance matching except in a narrow range of frequencies between 1250 MHz and about 1400 MHz.

Figure 7:
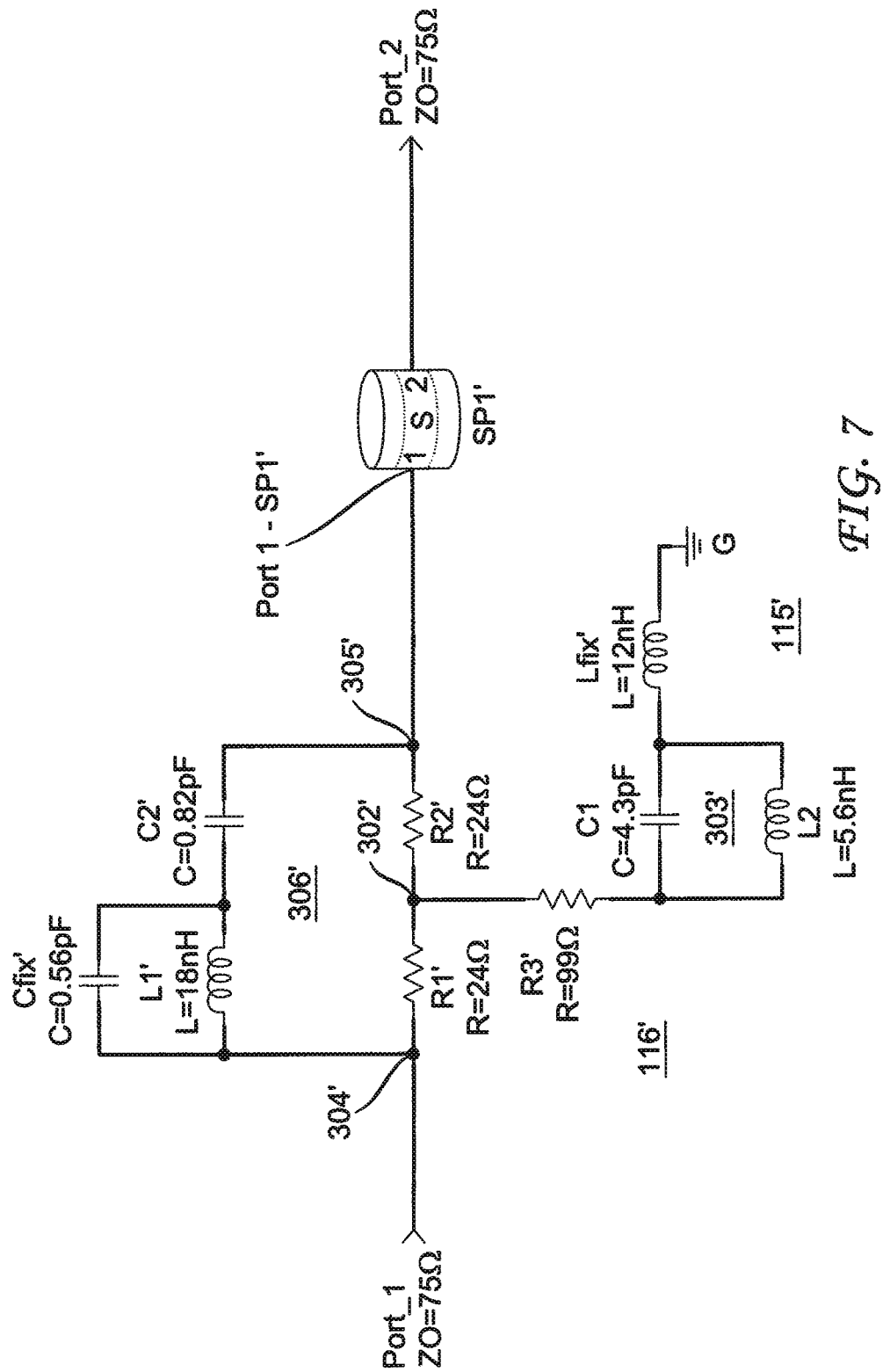
FIG. 7 illustrates a detailed schematics of a second embodiment of the band-pass filter/termination of FIG. 1.

FIG. 7 illustrates a circuit diagram of improved band-pass filter/termination 115' of FIG. 1, embodying another advantageous feature. Similar symbols and numerals in FIGS. 1 and 2 and 7, except for the addition of a prime symbol, ', in FIG. 7, indicate similar items or functions. In a termination portion 116' of band-pass filter/termination 115' of FIG. 7, a capacitor Cfix' is coupled in parallel with an inductor L1' forming an addition relative to filter/termination 115 of FIG. 2. The inclusion of capacitor Cfix' provides a transfer function or transmission "zero" below 950 MHz. The combination of capacitors Cfix' and C2' resonate with inductor L1' at 1000 MHz. The ratio of the capacitance of capacitor Cfix' to that of capacitor C2' can be adjusted to improve the impedance matching at 800 MHz and below. Also, an inductor Lfix' is coupled in series with a parallel resonant circuit 303' that includes an inductor L2' for resonating with capacitor C1' above 1000 MHz. Whereas, inductor L2' and capacitor C1' resonate at approximately 1000 MHz. The addition of inductor Lfix' provides a transfer function or transmission "zero" above 1050 MHz. The ratio of the inductance of inductor Lfix' to that of inductor L2' can be adjusted to improve the impedance matching at 1250 MHz and above.

Figure 8:
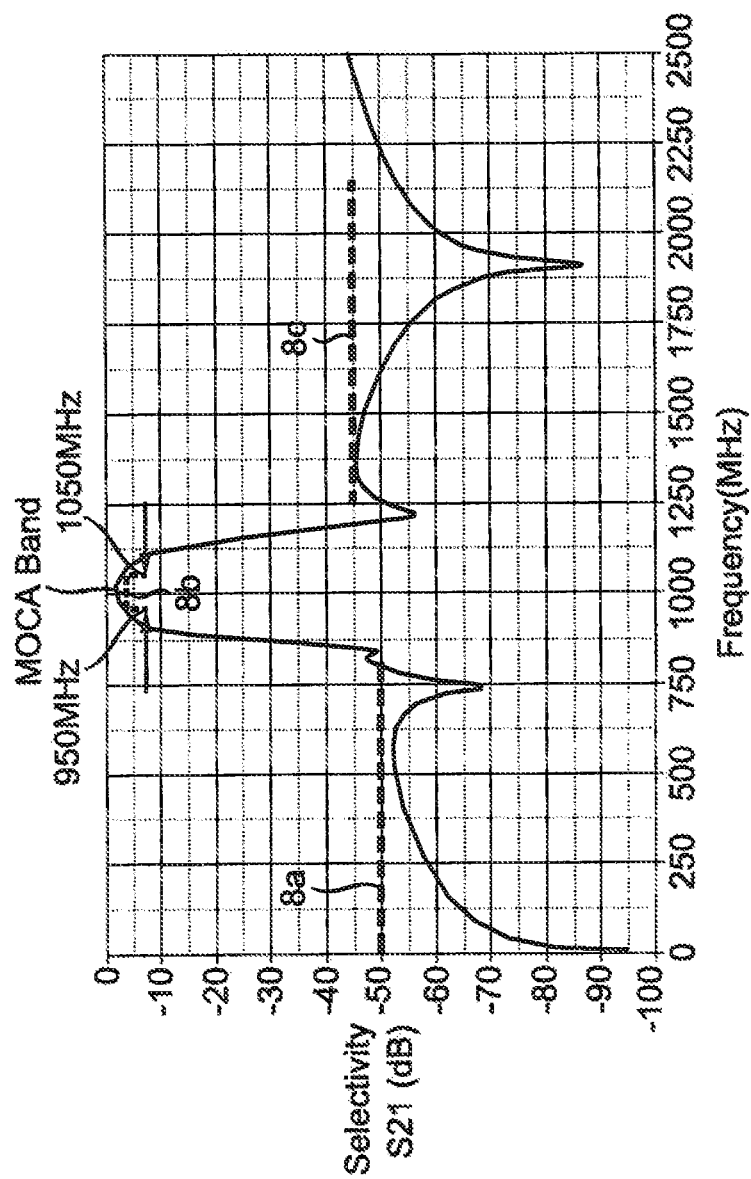
FIG. 8 illustrates a graph showing the selectivity or S-parameter S21 of the band-pass filter/termination of FIG. 7.

The values of the components of termination portion 116' of band-pass filter/termination 115' of FIG. 7 are, as follows:

R1'=24 Ohm
R2'=24 Ohm
R3'=99 Ohm
L1'=18 nH
L2'=5.6 nH
Lfix'=12 nH
C1'=4.3 pF
C2'=0.82 pF
Cfix'=0.56 pF FIG. 8 illustrates a graph showing the selectivity or S-parameter S21 of band-pass filter/termination 115' of FIG. 7 that includes band-pass filter SP1'. S-parameter S21 of FIG. 8 represents the power received at port 2 of band-pass filter/termination 115' of FIG. 7 relative to the power input at port 1 that is at terminal 304' of band-pass filter/termination 115' of FIG. 7. A broken line 8a of FIG. 8, a broken line 8b and a broken line 8c represent the same specification limit requirements of broken lines 5a, 5b and 5c, respectively, of FIG. 5. As shown in FIG. 8, S-parameter S21 of band-pass filter/termination 115' of FIG. 7 fully meets the specification limits.

Figure 9:
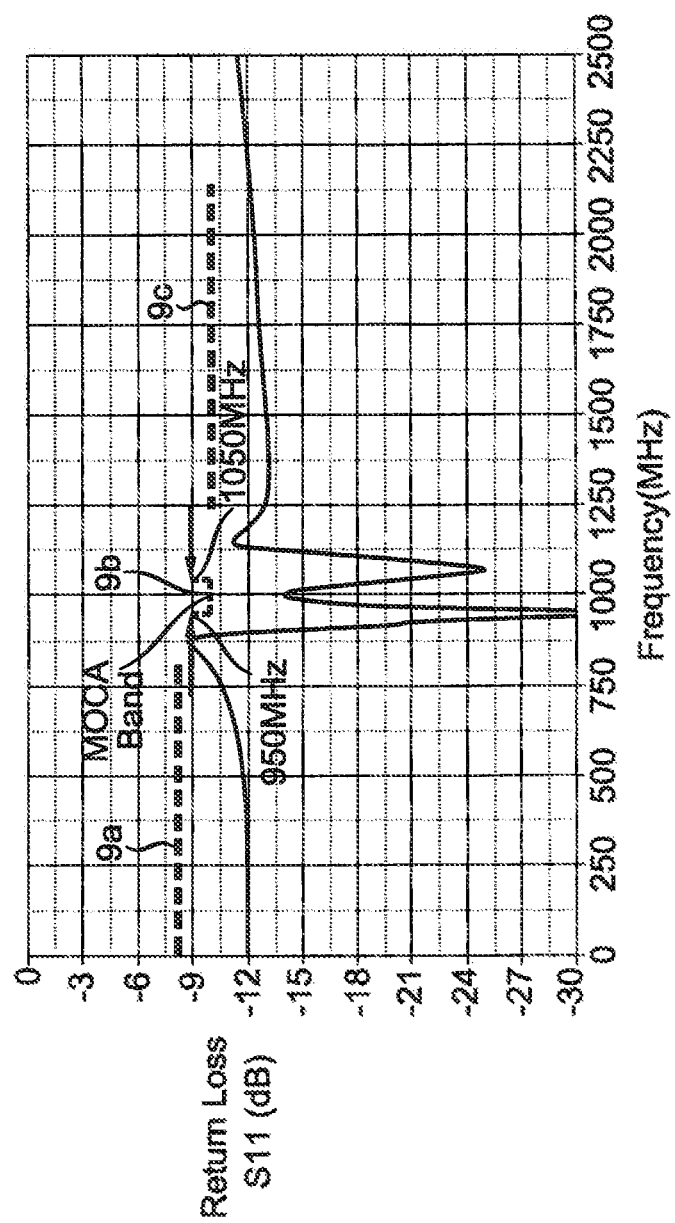
FIG. 9 illustrates a graph showing the return loss or S-parameter S11 of the band-pass filter/termination of FIG. 7.

FIG. 9 illustrates a graph showing the return loss or S-parameter S11 of band-pass filter/termination 115' of FIG. 7. S-parameter S11 of FIG. 9 represents the power reflected from port 1 of band-pass filter/termination 115' of FIG. 7 relative to the power input at port 1 of band-pass filter/termination 115'. A broken line 9a of FIG. 9, a broken line 9b and a broken line 9c represent the specification limit requirements of broken lines 6a, 6b and 6c, respectively, of FIG. 6. As shown in FIG. 9, S-parameter S11 of band-pass filter/termination 115' of FIG. 7, advantageously, fully meets the specification limits.

The invention claimed is:

1. A termination network coupled in operation to an input of a band-pass filter, comprising:
   a first resistor coupled to a second resistor to form a voltage divider for voltage dividing a first radio frequency (RF) input signal that is applied, as attenuated by said voltage divider, to said filter input; and
   a first resonant circuit responsive to said first RF input signal for controlling a magnitude of a second RF input signal developed at said filter input, said second RF input signal having a larger magnitude when said first RF input signal is at a resonant frequency of said first resonant circuit, relative to when said first RF input signal is outside a range of frequencies that includes said resonant frequency.

2. The termination network according to claim 1, comprising a third resistor for coupling the voltage divided, first RF input signal to said filter input.

3. The termination network according to claim 1 wherein said filter comprises a band pass filter for passing a Multimedia over Cable Alliance (MOCA) frequency range.

4. The termination network according to claim 1 wherein said frequency range comprises a Multimedia over Cable Alliance (MOCA) frequency range and wherein an upper limit of the frequencies that are outside said range of frequencies is at least 2000 MHz.

5. The termination network according to claim 1 wherein said first resonant circuit comprises a parallel resonant circuit that is coupled in series with said second resistor.

6. The termination network according to claim 5, comprising a third resistor for coupling to said filter input a signal developed in said series coupled parallel resonant circuit and said second resistor.

7. The termination network according to claim 6 wherein said first, second and third resistors are coupled in a T-shaped configuration.

8. The termination network according to claim 5 wherein said parallel resonant circuit comprises a first capacitor coupled in parallel with a first inductor.

9. The termination network according to claim 8, comprising a second inductor coupled in series with said parallel resonant circuit.

10. The termination network according to claim 1 wherein said first resonant circuit comprises a series resonant circuit that is coupled to said filter input in a manner to bypass said first resistor.

11. The termination network according to claim 10 wherein said series resonant circuit comprises a second capacitor coupled in series with a third inductor.

12. The termination network according to claim 11, comprising a third capacitor coupled in parallel with said third inductor.

13. The termination network according to claim 11, comprising a parallel resonant circuit that is coupled in series with said second resistor.

14. The termination network according to claim 13 wherein said parallel resonant circuit comprises a first capacitor coupled in parallel with a first inductor.

15. The termination network according to claim 14, comprising a second inductor coupled in series with said parallel resonant circuit.

16. The termination network according to claim 15, comprising a third resistor having a first terminal coupled between said first and second resistors and a second terminal coupled to said filter input.

17. The termination network according to claim 16 wherein said first, second and third resistors form a T-shaped configuration.

18. A termination device comprising a band-pass filter, said termination device comprising:
   a first resistor coupled to a second resistor to form a voltage divider for voltage dividing a first radio frequency (RF) input signal that is applied, as attenuated by said voltage divider, to an input of said band-pass filter; and
   a first resonant circuit responsive to said first RF input signal for controlling a magnitude of a second RF input signal developed at said filter input, said second RF input signal having a larger magnitude when said first RF input signal is at a resonant frequency of said first resonant circuit, relative to when said first RF input signal is outside a range of frequencies that includes said resonant frequency.

19. The termination device of claim 18 wherein said first resonant circuit comprises a parallel resonant circuit that is coupled in series with said second resistor.

* * * * *